(12) United States Patent
Uppireddi et al.

(10) Patent No.: US 8,784,766 B1
(45) Date of Patent: Jul. 22, 2014

(54) DIAMOND SYNTHESIS EMPLOYING NANOPARTICLE SEEDS

(75) Inventors: Kishore Uppireddi, San Juan, PR (US); Gerardo Morell, Guaynabo, PR (US); Brad R. Weiner, Dorado, PR (US)

(73) Assignee: The University of Puerto Rico, San Juan, PR (US)

( * ) Notice: Subject to any disclaimer, the term of this patent is extended or adjusted under 35 U.S.C. 154(b) by 318 days.

(21) Appl. No.: 12/689,180

(22) Filed: Jan. 18, 2010

Related U.S. Application Data

(60) Provisional application No. 61/145,260, filed on Jan. 16, 2009.

(51) Int. Cl.
  *B01J 3/06* (2006.01)

(52) U.S. Cl.
  USPC .......................................... 423/446; 977/773

(58) Field of Classification Search
  None
  See application file for complete search history.

(56) References Cited

U.S. PATENT DOCUMENTS

| | | | | |
|---|---|---|---|---|
| 4,254,091 A | * | 3/1981 | Woermann et al. | 423/446 |
| 5,264,701 A | * | 11/1993 | Crain | 250/374 |
| 5,437,891 A | * | 8/1995 | Anthony et al. | 427/249.11 |
| 5,485,804 A | * | 1/1996 | Adair et al. | 117/90 |
| 6,001,304 A | * | 12/1999 | Yoo et al. | 419/10 |
| 2008/0187479 A1 | * | 8/2008 | Munday | 423/290 |
| 2009/0257942 A1 | * | 10/2009 | Sung | 423/446 |

OTHER PUBLICATIONS

Machi et al. Synthesis of Diamond Using Fe Catalysts by RF Plasma Chemical Vapor Deposition Method; Jpn. J. Appl. Phys.; vol. 31 pp. 1958-1963; 1992.*

Resto et al.; Iron Oxide Nanoparticles Employed as Seeds for the Induction of Microcrystalline Diamond Synthesis; Nanoscale Re. Lett. 3, pp. 65-70; Jan. 24, 2008.*

Haubner et al.; Sol-gel preparation of Catalyst Particles on Substrates for Hot-Filament CVD Nanotube Deposition; Diamond & Related Materials; 17, pp. 1452-1457; 2008.*

Machi et al.; Synthesis of Diamond Using Fe Catalysts by RF Plasma Chemical Vapor Deposition Method; Jpn. J. Appl. Phys.; vol. 31 pp. 1958-1963; 1992.*

* cited by examiner

*Primary Examiner* — Guinever Gregorio
(74) *Attorney, Agent, or Firm* — Hoglund & Pamias, P.S.C.; Roberto J. Rios

(57) ABSTRACT

Iron nanoparticles were employed to induce the synthesis of diamond on molybdenum, silicon, and quartz substrates. Diamond films were grown using conventional conditions for diamond synthesis by hot filament chemical vapor deposition, except that dispersed iron oxide nanoparticles replaced the seeding. This approach to diamond induction can be combined with dip pen nanolithography for the selective deposition of diamond and diamond patterning while avoiding surface damage associated to diamond-seeding methods.

27 Claims, 5 Drawing Sheets

DIAMOND SYNTHESIS EMPLOYING NANOPARTICLE SEEDS

GOVERNMENT INTEREST

The claimed invention was made with U.S. Government support under grant number NSF-0701525 awarded by the National Science Foundation (NSF), and grant numbers NNG05GG78H, NCC5-595 and NCC3-1034 awarded by the National Aeronautics and Space Administration (NASA). The government has certain rights in this invention.

BACKGROUND OF THE INVENTION

Many challenges remain opening regarding the integration of diamond into electronic devices. In particular, seeding processes are typically harsh on the substrate surface, leading to defect creation and lack of reproducibility. Iron-based materials have been used as catalysts in the synthesis of crystalline diamond by high temperature, high-pressure growth. Yet, it is difficult to fabricate diamond on iron-based materials by chemical vapor deposition (CVD) due to the rapid diffusion of carbon into the bulk and high carbon solubility. There have been a number of attempts to grow diamond by forming a thin film of iron on silicon substrates. Higher diamond nucleation densities with significant amounts of a-C are attained by depositing a thin layer of iron on silicon substrates, thus suggesting that a high carbon concentration resulting in a saturated carbide layer during the initial stage of nucleation is required for producing diamond nucleation sites. The prior art further indicates that there is an optimum iron thickness at which diamond growth prevails.

Thus, there exists a need for an efficient process that selectively yields high quality diamond films at relatively high growth rate with negligible co-deposition of amorphous carbon, and avoids any pre and post treatment of the substrate in order to prevent any undue damage to it.

SUMMARY OF THE INVENTION

The above-described developments suggest that the Fe nanoparticles can be employed as diamond nucleation centers: they have a strong affinity for C atoms and yet they are too small to act as C sinks. FeO nanoparticles (nFeO) are ideal candidates for this task because the Fe nanoparticle is passivated by O, which is then removed by the CVD reactions, leaving the active Fe nanoparticle exposed for C trapping and accumulation.

The present invention provides an efficient process of producing high quality diamond films on metal, semiconductor or insulator substrates, employing metal compound nanoparticle seeds.

According to an aspect of the invention, diamond is obtained over a substrate is by providing a substrate; depositing metal compound nanoparticle seeds on the substrate, said metal being capable of carbide formation; and directing a stream of fluid composition at the seeded substrate under conditions that effect diamond growth.

In accordance to another aspect of the invention, a metal substrate is selected from copper, molybdenum, aluminum, tantalum, tungsten, nickel or combinations thereof.

According to a further aspect of the invention, the semiconductor substrate is selected from silicon, germanium, gallium arsenide or combinations thereof.

In still another aspect of the invention, the insulator substrate is selected from quartz, glass, gallium nitride, silicon carbide, boron nitride or combinations thereof.

The present invention particularly provides a process for selective deposition of diamond on silicon, molybdenum or quartz substrate using Iron oxide nanoparticles (nFeO) as seeds. One important aspect of the present invention is that the process is devoid of any diamond powder seeding and avoids subjecting the substrate to any undue damage.

In an aspect of the invention, the metal compound nanoparticles of this invention are characterized by a size in the range of 1-50 nm, preferably 4-15 nm.

In another aspect of invention, the metal compound nanoparticles of this invention are characterized by a surface density in the range of $10^5$-$10^{10}$ per $cm^2$, preferably $10^7$-$10^{10}$ per $cm^2$.

The distribution of nanoparticles plays a significant role in the deposition of diamond film on the substrate. Thus, according to an aspect of the invention the process provides a nanoparticle layer that is uniformly distributed.

According to another aspect of the invention, the coated substrates of the present process are kept at a temperature in a range of from about 100° C. to about 1000° C., preferably in a range of from 400° C. to 800° C.

In the process of the present invention no post-treatment like plasma etching is required to enhance the post-deposition quality of the diamond films. Thus, in a further aspect of the invention, a process is provided wherein the growth rate for diamond formation is in the range of 1.7-1.9 μm/h.

According to an aspect of the invention, a fluid composition is directed on the substrate seeded with metal nanoparticles, and said composition comprises at least one compound having at least one carbon-hydrogen bond and a diluent gas. In an embodiment of the invention the compound having at least one carbon-hydrogen bond is methane. According to another embodiment of the present invention the diluent gas is selected from hydrogen, nitrogen, helium, neon, argon, xenon or krypton.

In another aspect of the invention, the process of obtaining diamond over a substrate comprises providing a substrate; depositing iron oxide nanoparticles seeds on the substrate; and directing a stream of carbon-containing fluid composition at the seeded substrate under conditions that effect diamond growth.

In a further aspect of the invention, the coated substrate is kept at a temperature in a range of from about 700° C. to about 750° C. and the fluid composition comprises methane ($CH_4$) and hydrogen ($H_2$). The iron oxide nanoparticles used to induce the formation of microcrystalline diamond films have a uniform size distribution in the range of 7-10 nm and a surface density in the range of $10^7$-$10^{10}$ per $cm^2$.

The observed diamond nucleation density was of the same value as the initial nFeO surface density and was similar to those typically obtained by diamond-seeded deposition process. This result is contrary to the prior art methods that involved some form of Fe seeding (typically thin Fe films) but suffered from substantial co-deposition of amorphous carbon.

According to another aspect of the invention, the process can be used for selective diamond deposition and patterning at the nanoscale level through Dip Pen Nanolithography followed by chemical vapor deposition and can be applied to coat high quality crystalline diamond to structures with high aspect ratio, the interior surfaces of odd shaped structures and conformal coating on cutting tools with ease by adopting a convenient method of placing the FeO nanoparticles uniformly.

The extreme properties of diamond (i.e., large electrical breakdown field, high saturated current density, high thermal conductivity) lead to the applicability of diamond to high temperature and high power devices. The present invention is a novel diamond process technology with minimum defect creation that does not impede the carriers mobility, and is an efficient process for producing high quality diamond for the potential integration of diamond into active electronic application. The selectivity of the deposition process renders added advantage to the device manufacturing with the current silicon microelectronic processing technologies.

According to a further aspect of the invention, the process can also be used to provide protective coating for metal and non-metal substrates to avoid their wear and tear especially in the field of prosthetics, tribology and microelectronics.

BRIEF DESCRIPTION OF THE DRAWINGS

Further features and advantages of the invention will become apparent from the following detailed description taken in conjunction with the accompanying figures showing illustrative embodiments of the invention, in which.

DETAILED DESCRIPTION OF THE INVENTION

Experimental Details

Figure 1:
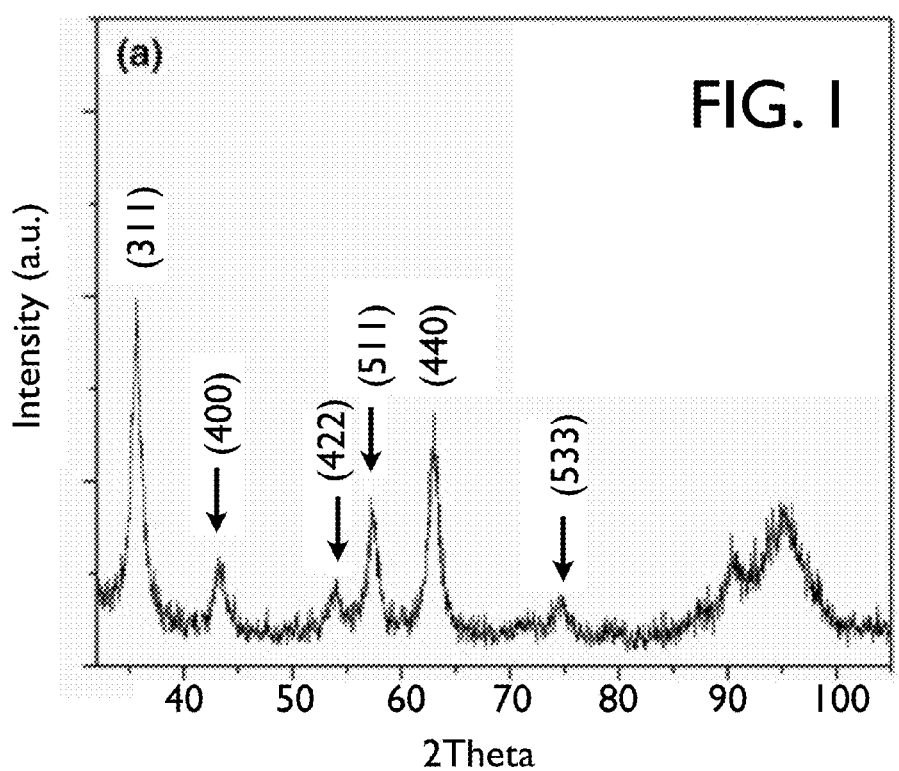
FIG. 1 shows an X-ray diffractogram of nFeO particles employed to induce diamond growth according to an embodiment of the present invention.

A seed solution of iron oxide nanoparticle was prepared by dissolving 2-4 g of iron oxide nanoparticle (nFeO) powder in 30 ml of methanol. The solution was then ultrasonicated from about 15-20 min. Microcrystalline diamond particles and films were synthesized using a custom-built hot filament CVD (HFCVD) apparatus. The films were grown on 14-mm diameter and 0.5-mm thick Mo, Si, and quartz substrates. The substrates were cleaned by sonication in methanol and acetone and dried with inert gas. The nanoparticle seed solution was coated on the substrate using a spin coater for uniform distribution of nFeO particles on the substrate, which is vital for obtaining a uniform diamond film. After cleaning, a suspension of nFeO with nominal particle size distribution in the 7-10 nm range was applied to the substrates. The surface density of nFeO clusters was estimated to be ~$10^7$ cm$^{-2}$ by atomic force microscopy and scanning electron microscopy (SEM). However, scattered micron-size patches of unseeded substrate remained. No diamond powder seeding was employed.

A mixture of 2% $CH_4$ in $H_2$ with a total flow of 100 sccm was directed over the heated rhenium filament kept at 2,700 K and 10 mm above the substrate. The total pressure was kept constant at values between 20 and 50 Torr (2.6–6.6 kPa). The substrates were maintained around 700-730° C. and the deposition time was varied between 30 min and 6 h.

The surface morphology of the films was investigated by SEM. Small portions of the diamond samples were placed on Formvar-coated Cu grids and uncoated silicon nitride TEM grids for energy-filtered transmission electron microscopy (EFTEM) and electron energy-loss spectroscopy (EELS) using an energy-filtered LEO 922 OMEGA microscope operating at an accelerating voltage of 200 kV. The structural phases of the films were characterized by micro-Raman spectroscopy (RS) using a triple monochromator with 1 cm$^{-1}$ resolution and the 514.5 nm Ar-ion laser line for excitation. The spectra were recorded using an 80× objective that probes an area of about 1-2 μm$^2$. The UV Raman spectra were measured using a double monochromator with a resolution of 3-4 cm$^{-1}$ and the second harmonic generation of 488 nm radiation (244 nm) from an Ar-ion laser.

The X-ray diffraction (XRD) measurements were taken on a Siemens D5000 diffractometer using the Cu $K_\alpha$ line source (k=1.5405 Å) in θ-2θ configuration. The X-ray photoelectron spectroscopy (XPS) measurements were taken using a Physical Electronic system for elemental analysis at room temperature, which was operated in the constant energy pass mode using monochromatic Al $K_\alpha$ X-rays ($h_0$=1,486.6 eV). The resolution of the electron energy analyzer was around 0.25 eV.

The procedure employed for the deposition of diamond films on silicon substrates was the same as outlined above for Molybdenum substrate. Due to the polished and unpolished surface of the silicon substrate (commercial substrate from vendor), the distribution of seed nanoparticles was not uniform leading to non-uniformity of the density. This resulted in crystalline diamond growth in the regions where density was around $10^7$ per cm$^2$ and carbon nanotubes and fiber growth in the regions where density of particles was greater than equal to $10^9$ per cm$^2$. Though crystalline diamond was obtained, there was little presence of amorphous carbon due to non-uniform distribution of seed nFeO particles.

The procedure employed for the deposition of diamond films on quartz substrates was the same as outlined above for Molybdenum substrate. The substrates were 14 mm in diameter with 0.5 mm in thickness. Though the substrates showed some regions of carbon nanotubes and fiber growth, most of the surface prevailed with crystalline diamond growth and the presence of amorphous carbon was low. The regions of carbon nanotubes and fibers growth on the substrate can be attributed to the high density/agglomeration of nFeO nanoparticles due to non-uniform distribution.

Results and Discussion

Figure 2:
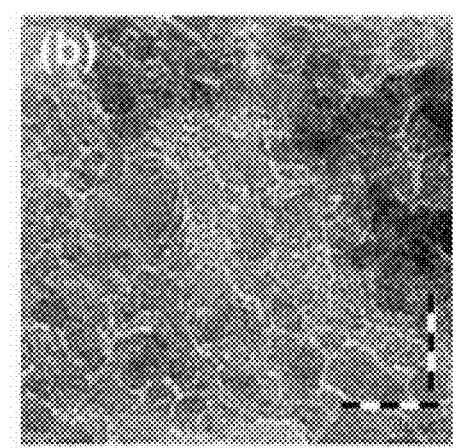
FIG. 2 is an EFTEM image of nFeO showing its particle size according to an embodiment of the present invention.
Figure 3:
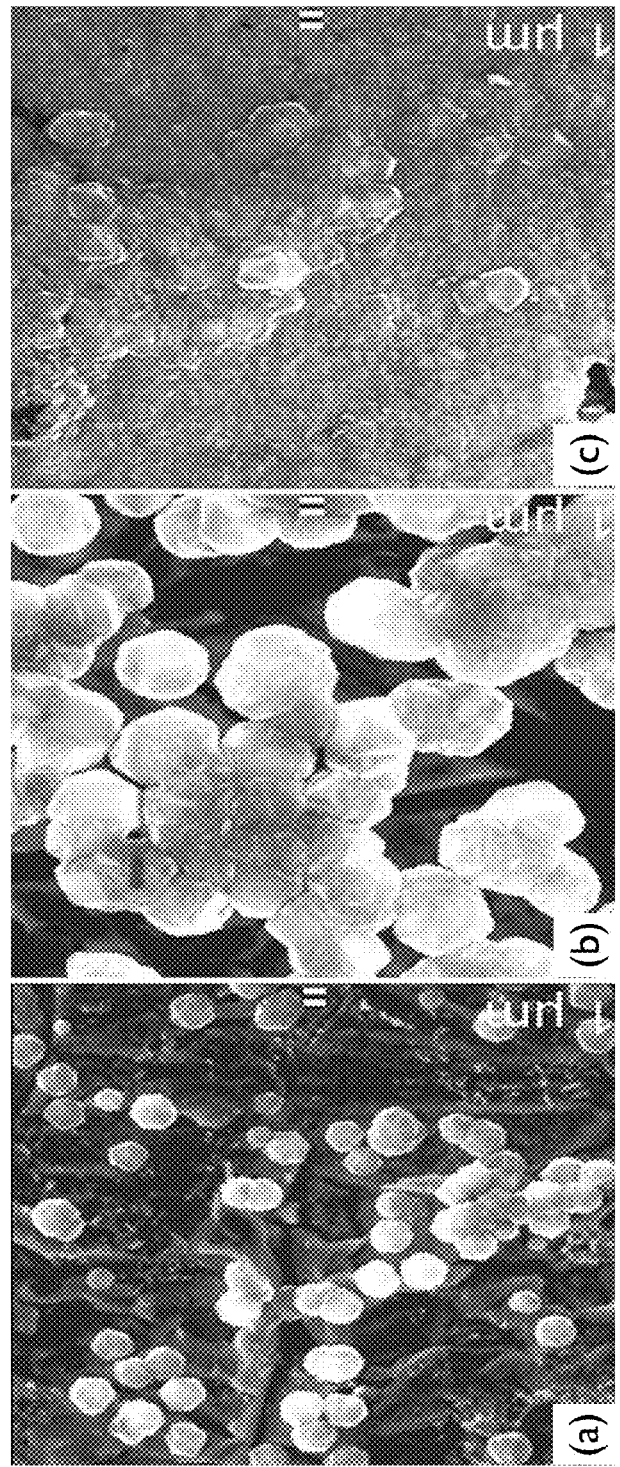
FIG. 3 shows SEM images of nFeO-induced diamond deposited on Mo substrates for (a) 30 min, (b) 2 h and (c) 6 h according to an embodiment of the present invention.

The structure of the initial nFeO was determined by XRD as shown in FIG. 1. The diffractogram corresponds to cubic iron oxide (i.e., maghemite). The average size of the nanoparticles was determined to be around 10 nm using EFTEM as shown in FIG. 2. These nFeO induced the synthesis of microcrystalline diamond, as shown in the SEM images of FIG. 3 for different deposition times: 0.5, 2, and 6 h. Micron-size well-faceted diamond particles are readily observed for a deposition time of 30 min, as shown in image (a) of FIG. 3. The diamond crystallite size increased proportionally for a deposition time of 2 h, and lateral collision of growing particles began forming a film, as shown in image (b) of FIG. 3. A deposition time of 6 h led to quite continuous films of about 10-11 μm thickness with a few scattered gaps, as shown in image (c) of FIG. 3. The Bragg reflections characteristic of <111> and <400> diamond lattice planes were obtained for all the films (data not shown). Control experiments to grow diamond directly on Mo, Si, and quartz without nFeO or diamond seeding were unsuccessful for deposition times of 6 h, as expected, except for the formation of a MoC or a SiC surface layer according to XRD.

The diamond growth rates were around 1.7-1.9 μm/h, which is substantially high for HFCVD (typically 0.1-0.2 μm/h), and the observed nucleation densities were around $10^7$ $cm^{-2}$, corresponding well to the initial nFeO density and similar to those typically obtained by diamond-seeded diamond deposition. In contrast, previous reports of methods involving some form of Fe seeding, typically thin Fe films, suffered from low growth rates and substantial co-deposition of amorphous carbon (a-C). Although there might be a slight effect on the nucleation density due to mechanical polishing of the Mo substrates, it does not sufficient to account for the results described above, especially since the quartz and Si substrates were not mechanically polished but nevertheless the growth of a microcrystalline diamond film was also successfully induced on them by nFeO. Another important difference is the diamond quality of the nFeO-induced diamond films according to their Raman spectra.

Figure 4:
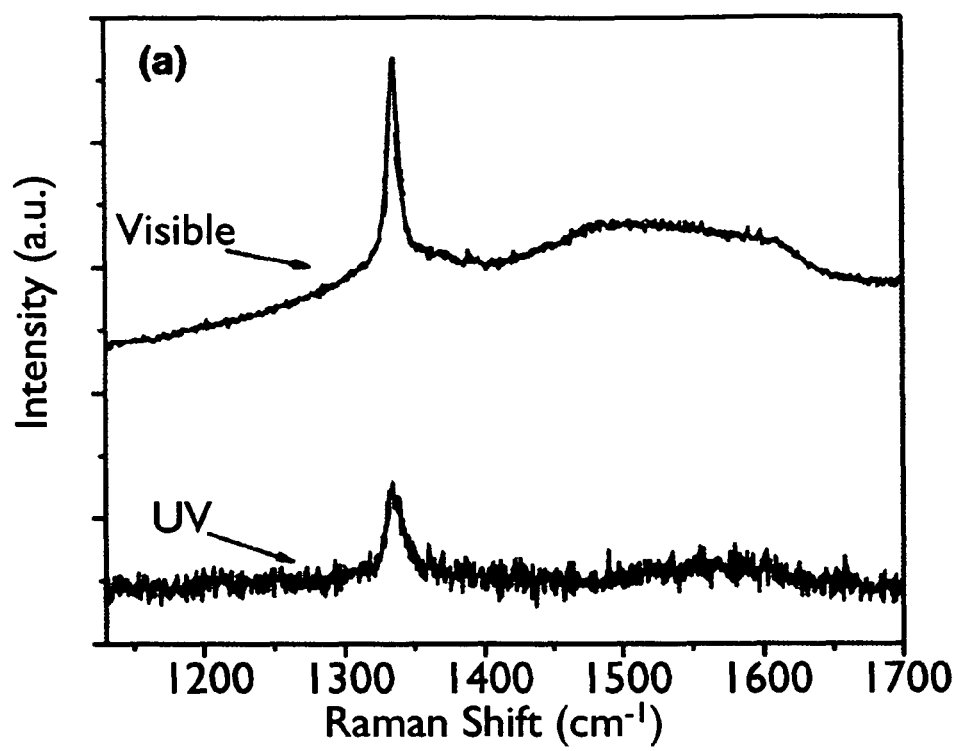
FIG. 4 shows a plot of representative visible and UV Raman spectra of nFeO-induced microcrystalline diamond on Mo substrates and a plot of deconvoluted visible Raman spectrum according to an embodiment of the present invention.
Figure 4:
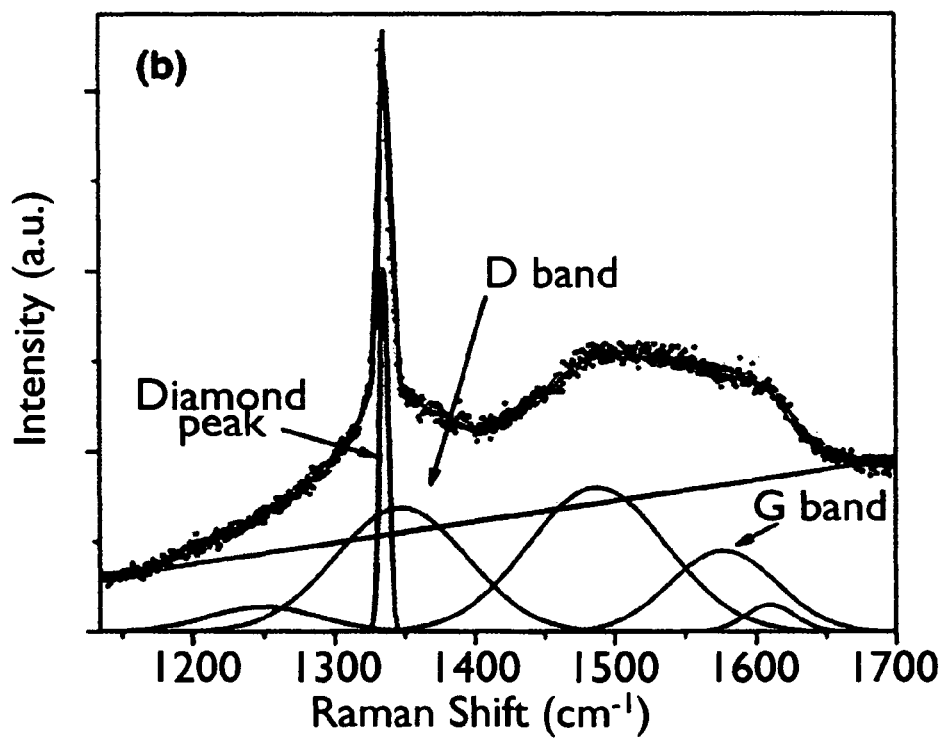

The bonding structure of the material was determined by RS excited with two radiation energies: visible (2.4 eV) and UV (5.1 eV). The combination of visible and UV Raman is an effective approach for probing both kinds of carbon materials because the Raman scattering cross-section for $sp^2$-bonded carbon in the visible region is 50-230 times higher than that of $sp^3$-bonded carbon. The Stokes-shifted visible and UV Raman spectra of the nFeO-induced diamond films are shown in FIG. 4, plot (a). They indicate that there is a relatively small presence of $sp^2$-bonded carbon in the nFeO-induced diamond films. (No plasma etching or any other treatment was performed to enhance the post-deposition diamond quality of the films.)

The deconvolution of the Raman spectra was done using a Voigt function corresponding to the diamond peak, and five Gaussians corresponding to the D and G bands, and the bands centered at ~1,285, 1,490, and 1,610 $cm^{-1}$. The spectra were corrected for instrumental broadening to obtain the intrinsic diamond peak widths. FIG. 4, plot (b) shows a sample spectral simulation. The diamond peak FWHM obtained from these simulations is ~8-10 $cm^{-1}$, and the diamond quality factor is around 97-98%, further indicating the good quality of the films and their similarity to diamond-seeded HFCVD diamond films. The diamond peak is always blue-shifted in the 1,333.5-1,335.5 $cm^{-1}$ range, indicating compressive stresses of around 0.6-1.7 GPa. Similar Raman spectra, growth rates, XRD diffractograms are obtained for nFeO-induced diamond films deposited on quartz, Si, and Mo substrates under identical conditions, thus confirming the consistency of the above-described results and ruling out the possibility of an underlying substrate effect.

Figure 5:
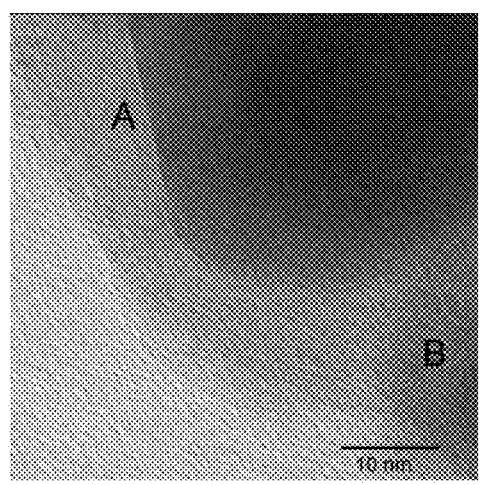
FIG. 5 is an EFTEM image showing the aggregation of carbon material around the Fe nanoparticle area according to an embodiment of the present invention.

Energy-filtered transmission electron microscopy and EELS were employed to investigate the initial growth phase of nFeO-induced diamond. The high-resolution EFTEM image shown in FIG. 5 shows the aggregation of carbon and formation of lattice planes around a seed nanoparticle (dark region). A fast Fourier transform analysis was employed to measure the spacing between the atomic planes, which were found to vary. The lattice spacing in different regions was measured to be 1.1, 1.16, 1.24, and 3.33±0.1 Å. These values correspond to graphite <006>, <112>, <110>, and <002> interplanar spacing, respectively, and at the same time the 1.1 and 1.24±0.1 Å values also correspond to diamond <311> and <220> interplanar spacing, respectively. Taken altogether, these results point toward the aggregation of graphitic carbon around the seed nanoparticle and the impending formation of diamond.

Figure 6:
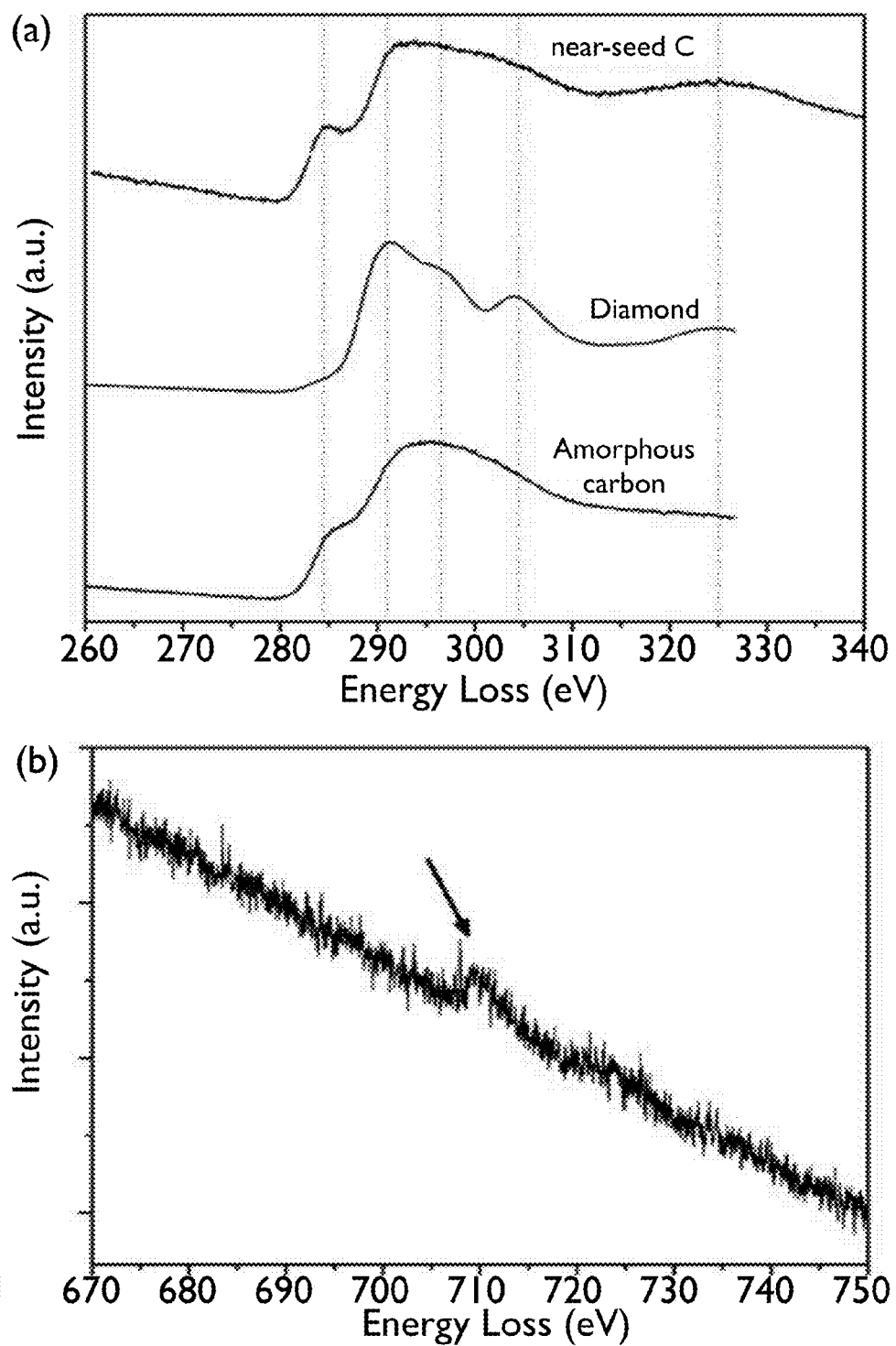
FIG. 6 shows comparison spectra for nFeO, a-C, and diamond according to an embodiment of the present invention.

Parallel EELS core-loss spectra of carbon K-edge and iron L-edge were collected on the area as shown in FIG. 5, and the corresponding spectra for nFeO, a-C, and diamond were also obtained for comparison, as shown in FIG. 6. There are features at ~285, ~290, ~297, ~305, and ~325 eV in the carbon K-edge spectrum. The peak at ~285 eV corresponds to the 0→π* electronic transition and is thus a signature of $sp^2$-bonded carbon. The higher energy features correspond to 0→σ* transitions of diamond-type carbon bonds. The observed broadening and smoothening of the EELS features corresponding to diamond-type bonds is due their co-existence with trigonally bonded carbon in the near-seed region. The Fe 2p edge shows a peak at ~710 eV as shown in FIG. 6, plot (b), corresponding to the transition of electrons from 2p orbitals to unoccupied 3d orbitals, confirming the role of iron nanoparticles as carbon clustering centers. No oxygen signal was detected by EELS due to the fact that the HFCVD conditions promote the reaction of surface O with H and C atoms to form HO and CO radicals, thus leaving the bare iron particles available to act as C traps.

Figure 7:
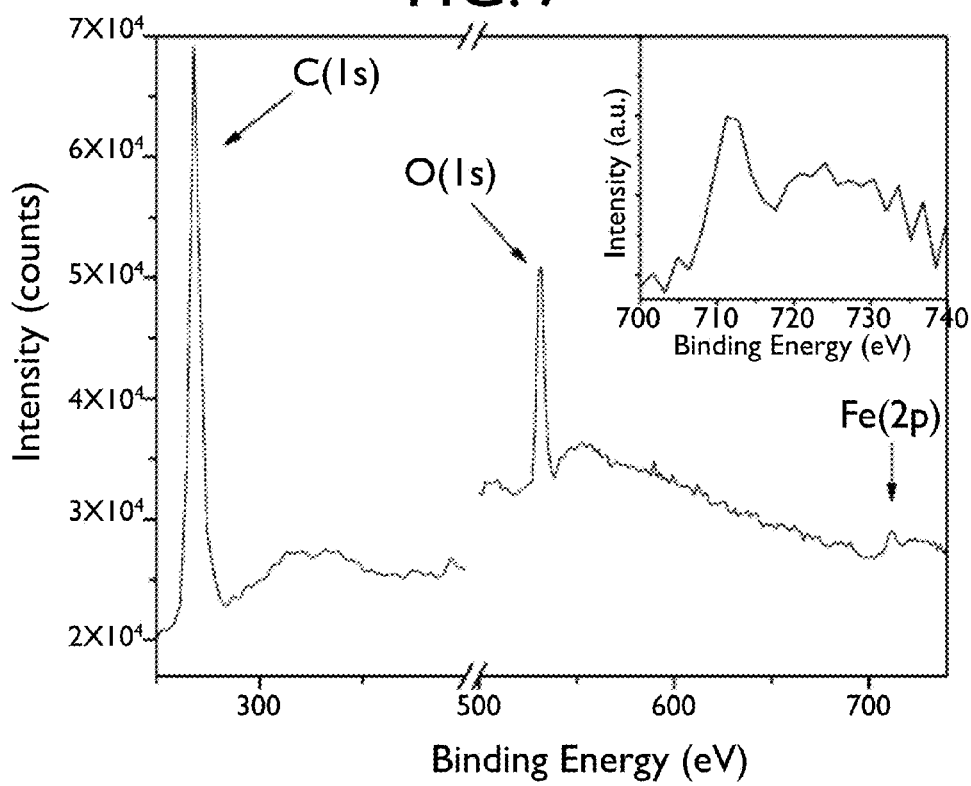
FIG. 7 shows carbon 1s core spectrum according to an embodiment of the present invention.

We also studied the average bonding environment of the material by XPS. The carbon is core spectrum shown in FIG. 7 indicates the strong presence of tetrahedral carbon ($sp^3$ C), in agreement with the Raman spectra. It also shows a strong oxygen is signature and a weak iron 2p signature at 531.5 and 711 eV, respectively. The presence of O on the surface is due to post-deposition adsorbates, while the relatively small Fe signature further confirms its saturation with C.

It has been reported that the formation of a very dense amorphous carbon phase can lead to diamond nucleation. In this process, spa-bonded C clusters start precipitating by consuming the carbon atoms from the dense amorphous carbon phase. Furthermore, there are theoretical studies indicating that diamond nuclei are stable structures when embedded in a-C matrix, and experiments showed that these serve as nucleation centers for subsequent growth. Thus the formation of a dense amorphous carbon phase is a plausible route for nucleating diamond. The iron nanoparticle may act as catalyst in decomposing the hydrocarbon under CVD conditions, after oxygen removal from the initial nFeO, leading to active carbon adsorption. Since there is no room for diffusion into the interior of the Fe nanoparticle and the amount of carbon that the Fe nanoparticle can adsorb is limited, there occurs densification of trigonally and tetrahedrally bonded carbon around the iron nanoparticle and the impending formation of diamond bonds.

From the above analysis, the synthesis of nFeO-induced microcrystalline diamond films can be summarized as follows: (a) iron oxide nanoparticles lose oxygen by chemical vapor reactions that lead to the formation HO and CO radicals, creating active nanoscale iron surfaces for the adsorption and decomposition of the incoming carbon-containing species, and thus for the formation of nanoscale C clusters with trigonal and tetrahedral C bonds; (b) as these carbon clusters densify around the iron nanoparticles, diamond-type bonds start precipitating; and (c) diamond film deposition continues to occur under conventional diamond growth conditions of high hydrogen dilution which keep the growing surface hydrogenated and preferentially etch away the trigonal carbon bonds.

CONCLUSIONS

The iron oxide nanoparticles were employed to induce the formation of diamond nuclei and the synthesis of microcrystalline diamond films. This approach yields relatively high diamond growth rates, low presence of amorphous carbon and can be used for the selective diamond deposition and patterning at the nanoscale through dip pen nanolithography of nFeO followed by chemical vapor deposition. The combined analysis of the various characterization results, indicate that the iron nanoparticles act as nucleation and aggregation sites for carbon and the impending formation of diamond-type bonds. The formation of a dense, mixed C phase around the Fe nanoparticles leading to the precipitation of spa C bonds is proposed as a plausible explanation for these results.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

The invention claimed is:

1. A method of synthesizing diamond comprising:
depositing iron oxide nanoparticle seeds on a substrate, said iron oxide nanoparticle seeds being capable of carbide formation;
and directing a stream of gas composition at the seeded substrate under conditions that effect diamond growth.

2. The method of claim 1, wherein said substrate comprises a metal substrate.

3. The method of claim 2, wherein said metal substrate comprises at least one of: copper, molybdenum, aluminum, tantalum, tungsten, and nickel.

4. The method of claim 1, wherein said substrate comprises a semiconductor substrate.

5. The method of claim 4, wherein said semiconductor substrate comprises at least one of: silicon, germanium, and gallium arsenide.

6. The method of claim 1, wherein said substrate comprises an insulator substrate.

7. The method of claim 6, wherein said insulator substrate comprises at least one of: quartz, glass, gallium nitride, silicon carbide, and boron nitride.

8. The method of claim 1, wherein said iron oxide nanoparticle seeds have a size of about 1 nm to about 50 nm.

9. The method of claim 1, wherein said iron oxide nanoparticle seeds have a size of about 4 nm to about 15 nm.

10. The method of claim 1, wherein said iron oxide nanoparticle seeds have a surface density of about $10^7$ cm$^2$ to about $10^{10}$ cm$^2$.

11. The method of claim 1, wherein said iron oxide nanoparticle seeds have a surface density of about $10^5$ cm$^2$ to about $10^7$ cm$^2$.

12. The method of claim 1, wherein once said substrate is coated, is kept at a temperature of from about 100° C. to about 1000° C.

13. The method of claim 1, wherein once said substrate is coated, is kept at a temperature of from about 400° C. to about 800° C.

14. The method of claim 1, wherein the growth rate for diamond formation is of about 1.7 μm/h to about 1.9 μm/h.

15. The method of claim 1, wherein said iron oxide nanoparticle seeds are uniformly distributed over the substrate.

16. The method of claim 1, wherein said gas composition comprises at least one compound having at least one carbon-hydrogen bond; and a diluent gas.

17. The method of claim 16, wherein said at least one compound having at least one carbon-hydrogen bond comprises methane ($CH_4$).

18. The method of claim 16, wherein said diluent gas is selected from the group consisting of: hydrogen, nitrogen, helium, neon, argon, xenon and krypton.

19. The method of claim 1, wherein said substrate has a diameter of about 14 mm and a thickness of about 0.5 mm.

20. The method of claim 1, wherein the step of depositing said iron oxide nanoparticle seeds on the substrate comprises:
coating said substrate with a uniformly distributed iron oxide nanoparticle seeds.

21. The method of claim 1, wherein the step of directing a stream of gas composition at the seeded substrate comprises:
positioning said coated substrate inside a chemical vapor deposition (CVD) apparatus; and
directing a mixture of methane ($CH_4$) in hydrogen ($H_2$) over a heated metal filament.

22. The method of claim 21, wherein said heated metal filament comprises rhenium (Re).

23. The method of claim 21, wherein said heated metal filament is kept at a temperature of about 2700 K and positioned at a distance of about 10 mm above said substrate.

24. The method of claim 21, further comprising: maintaining a constant pressure inside said (CVD) furnace of from about 20 Torr to about 50 Torr.

25. The method of claim 21, further comprising: maintaining said substrate at a temperature of from about 700° C. to about 730° C.

26. The method of claim 1, wherein continuous films of diamond are formed with a thickness of from about 10 μm to about 11 μm.

27. The method of claim 26, wherein said diamond films have a quality factor of from about 97% to about 98%.

* * * * *